(12) United States Patent
Fan

(10) Patent No.: US 6,433,726 B1
(45) Date of Patent: Aug. 13, 2002

(54) FRACTIONAL DECIMATION FILTER USING OVERSAMPLED DATA

(75) Inventor: Yiping Fan, Fremont, CA (US)

(73) Assignee: Koninklijke Philips Electronics N.V., Endhoven (NL)

( * ) Notice: Subject to any disclaimer, the term of this patent is extended or adjusted under 35 U.S.C. 154(b) by 0 days.

(21) Appl. No.: 09/887,454

(22) Filed: Jun. 22, 2001

(51) Int. Cl.[7] .................................................. H03M 1/12
(52) U.S. Cl. ........................ 341/155; 341/143; 375/316
(58) Field of Search ................................. 341/143, 155, 341/156, 123, 110, 115, 157; 327/254; 375/329, 316

(56) References Cited

U.S. PATENT DOCUMENTS

| | | |
|---|---|---|
| 5,548,540 A | 8/1996 | Staver et al. |
| 5,619,536 A * | 4/1997 | Gourgue ..................... 375/316 |
| 5,621,345 A * | 4/1997 | Lee et al. .................... 327/254 |
| 5,734,683 A * | 3/1998 | Hulkko et al. ............... 375/316 |
| 6,057,793 A | 5/2000 | Gong et al. |
| 6,081,216 A * | 6/2000 | May ........................... 341/143 |
| 6,121,910 A * | 9/2000 | Khoury et al. .............. 341/143 |
| 6,329,939 B1 * | 12/2001 | Swaminathan et al. ..... 341/143 |

FOREIGN PATENT DOCUMENTS

WO    WO 99/56427    4/1999

OTHER PUBLICATIONS

U.S. application No. 09/865,236, Fan, filed May 25, 2001, pending.

\* cited by examiner

*Primary Examiner*—Brian Young
*Assistant Examiner*—John Nguyen
(74) *Attorney, Agent, or Firm*—Harold Tsiang

(57) ABSTRACT

A decimator is provided that selectively varies the output sampling rate of an integer decimating device, such that the average output sampling rate corresponds to a desired output sampling rate. The output sampling rate varies such that an output sample is provided selectively after N input samples, or after N+1 input samples, to provide an output-to-input sampling ratio that is between N and N+1. This process introduces phase jitter as the sampling frequency varies between 1/N and 1/(N+1), but if the oversampling rate is high, and therefore N is high, as is typical of many applications that employ oversampling, the relative magnitude of the phase jitter is slight. A fractional accumulator is used to control whether the output occurs after N or N+1 input cycles, and is clocked by the input sampling clock, thereby minimizing the complexity of the embodiment.

19 Claims, 1 Drawing Sheet

FRACTIONAL DECIMATION FILTER USING OVERSAMPLED DATA

BACKGROUND OF THE INVENTION

1. Field of the Invention

This invention relates to the field of digital signal processing, and in particular to the down-sampling or decimation of data at a non-integer, or fractional, sample rate ratio.

2. Description of Related Art

Sample rate converters are common in the art. Data that is sampled at one rate is converted by a sample rate converter into data that is sampled at a second rate. Down-sampling, or decimation, is used to reduce the sampling rate, and up-sampling, or interpolation, is used to increase the sampling rate. Decreasing a sample rate by a factor of five, for example, can be effected by providing an output sample that corresponds to every fifth input sample. Increasing a sample rate by a factor of five is effected by repeating each input sample five times. Common down-sampling or up-sampling techniques use multiple input samples to generate each output sample. For example, in order to minimize noise and interference contribution to the output samples or to maximize the signal to noise ratio of the output samples of a down-sampler, a decimation filter determines the average, or weighted average, of multiple input samples as the output sample value. Additional input samples are often used in the up-sampling process in order to preserve the signal spectrum of the input sample. An interpolation filter provideses the value of each intermediate sample, based on an interpolation, or curve-fitting, of multiple input samples.

U.S. Pat. No. 5,548,540, "DECIMATION FILTER HAVING A SELECTABLE DECIMATION RATIO", issued Aug. 20, 1996 to Daniel A. Staver and Donald T. McGrath, and incorporated by reference herein, discloses the selection of different sets of coefficients for averaging a plurality of input samples to determine each output sample. An integer ratio (n:1) between input and output samples is assumed, such that at each $n^{th}$ input sample, an output sample is produced.

International patent application, WO 99/56427, "SAMPLE RATE CONVERTER USING POLYNOMIAL INTERPOLATION", filed Apr. 15, 1999 for Bruno J. G. Putzeys, and incorporated by reference herein, discloses the use of a polynomial approximation that is based on the phase of each output sample relative to the input samples, to determine output sample values corresponding to multiple input sample values. A phase-locked loop is used to provide a measure of the phase difference between the input and output samples. Different ratios of input to output sample rates are accommodated by the use of different sets of polynomial coefficients, and are not limited to integer ratios.

Given an input frequency of F1, and a desired output frequency of F2, the ratio F1/F2 can be expressed or approximated as N+P/Q, where N, P, and Q are integers, N being the integer portion of the ratio, and P/Q being the fractional part. Fractional scaling via integer upscaling and downscaling can be achieved by first upscaling by a factor of Q(Q*F1), and then downscaling by a factor of N*Q+P to provide F2=Q*F1/(N*Q+P)=F1/(N+P/Q).

Commonly, oversampling is used to provide highly-accurate analog-to-digital (A/D) conversion, using a technique termed "delta-sigma" conversion. A delta-sigma converter digitizes an analog signal at a very high sampling rate, then filters the samples to remove the noise and interference that is introduced by the sampling process and the communication channel from a transmitter to a receiver, then downsamples the filtered data to the desired sample rate. In a conventional delta-sigma converter, the oversampling rate, Q, and downsample rate, N*Q+P, are selected so as to provide the desired output sampling rate. In some applications, however, the oversampling rate and the desired output sampling rate are independently specified, and a fractional downsampling is required. For example, the direct sampling of an intermediate frequency signal often requires that the sampling frequency has certain relation with the intermediate frequency.

U.S. Pat. No. 6,057,793, "DIGITAL DECIMATION FILTER AND METHOD FOR ACHIEVING FRACTIONAL DATA RATE REDUCTION WITH MINIMAL HARDWARE OR SOFTWARE OVERHEAD", issued May 2, 2000 to Xue-Mei Gong, Tim J. Dupuis, Jinghui Lu, and Korhan Titizer, and incorporated by reference herein, discloses a combination of integer down-sampling and integer up-sampling to provide a fractional downsampling of over-sampled data, by first down-sampling the data, then upscaling the data. Such multi-staged scaling, however, consumes power for each stage, is costly to fabricate, and may not be suitable for low-power and/or low-cost consumer applications, such as cellular telephones and other portable devices.

BRIEF SUMMARY OF THE INVENTION

It is an object of this invention to provide a decimator that provides fractional down-scaling. It is a further object of this invention to provide a decimator that provides fractional down-scaling in a single decimation stage. It is a further object of this invention to provide fractional down-scaling via an integer-decimation process. It is a further object of this invention to provide a decimator that is well suited for low-power and/or low-cost applications.

These objects and others are achieved by providing a decimator that selectively varies the output sampling rate such that the average output sampling rate corresponds to the desired output sampling rate. The output sampling rate varies such that an output sample is provided selectively after N input samples, or after N+1 input samples, to provide an output-to-input sampling ratio that is between N and N+1. This process introduces phase jitter as the sampling frequency varies between 1/N and 1/(N+1), but if the over-sampling rate is high, and therefore N is high, as is typical of many applications that employ oversampling, the relative magnitude of the phase jitter is slight. A fractional accumulator is used to control whether the output occurs after N or N+1 input cycles, and is clocked by the input sampling clock, thereby minimizing the complexity of the embodiment.

BRIEF DESCRIPTION OF THE DRAWINGS

The invention is explained in further detail, and by way of example, with reference to the accompanying drawings wherein.

Throughout the drawings, the same reference numerals indicate similar or corresponding features or functions.

DETAILED DESCRIPTION OF THE INVENTION

Figure 1:
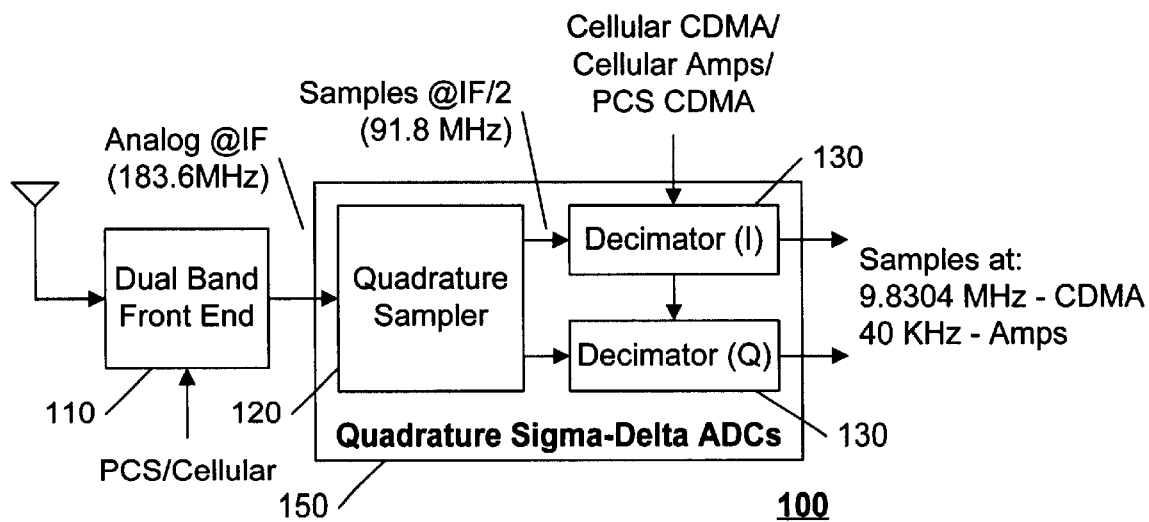
FIG. 1 illustrates an example communications device that includes a fractional decimator in accordance with this invention.

As is known in the art, communications systems are commonly designed to sample a received signal at a frequency that is substantially higher than the transmitted data rate. This higher sampling rate allows for proper decoding of the received signal in the presence of noise and/or interference effects as the modulated signal travels from the transmitter to the receiver. Because the higher sampling frequency is substantially higher than the transmitted data rate, the sampling introduces less quantization noise within the desired signal bandwidth. Because the higher sampling rate provides multiple samples corresponding to each transmitted data sample, a higher sampling rate facilitates the determination and use of samples corresponding to the best signal to noise ratio, as not every sample along the received analog waveform has the same signal to noise ratio. In general, an analog-to-digital converter with a higher sampling rate also requires fewer bits than a lower sampling rate analog-to-digital converter with the same conversion performance.

This invention is premised on the observation that many systems that use a high oversampling analog to digital converters are relatively insensitive to sampling jitter. As discussed below, the additional sampling jitter introduced by the fractional decimation approach in this invention is much less dominant as compared to the sampling phase error. This sampling phase error is the sampling time difference between the actual sampling point and the ideal sampling point within a chip or symbol period, where the maximum signal to noise ratio is realized. The sampling phase error occurs because a communication receiver typically does not know where the ideal sampling point is. Therefore, in an oversampling converter, multiple samples are taken by the analog to digital converter within a symbol or chip period and the sample with the highest SNR is used for further digital processing after the analog to digital conversion.

To achieve a fractional decimation, the particular decimation factor that is used to produce each output sample is selectably determined such that the average decimation factor among a stream of output samples corresponds to the desired fractional decimation (albeit thereby introducing phase jitter as different integer decimation factors are selected).

To minimize the magnitude of the phase jitter, the integer decimation factor is selectable from either a value of N to a value of N+1, wherein N is the integer component of the desired output-to-input sampling ratio. Given an input sample rate of F1 and an output sample rate of F2, the ratio F1/F2 can be expressed or approximated as N+P/Q, wherein N, P, and Q are integers and Q>P. To achieve an average sampling ratio of N+P/Q via integer-decimation, the input is decimated with a decimation factor of N for (Q−P) periods and with a decimation factor of N+1 for P periods. For example, if a 74:7 input:output sampling ratio is desired, the ratio is expressed as 10+4/7. In a preferred embodiment of this invention, three (Q−P) output sample are produced at intervals of 10(N) input samples, and four output samples are produced at intervals of 11 (N+1). At each of the three output samples of interval 10, the output sample will be produced "too soon", because the output sample rate is faster (1/10=7/70) than the intended 7/74 output sample rate. At each of the four output samples of interval 11, the output sample will be produced "too late", because the output sample rate is slower (1/11=7/77) than the intended 7/74 output sample rate. To minimize the accumulated phase shift that is caused by repeated "late" or "early" samples, the late and early samples are interspersed as much as possible.

FIG. 1 illustrates an example communications device 100 that includes a fractional decimator 130 in accordance with this invention. As is evident to one of ordinary skill in the art, sample-rate-conversion is used in a variety of applications, including communications systems, video processing systems, and so on. The communications device 100 is used herein as a paradigm for system that provides oversampled data samples and often requires fractional downsampling to provide filtered data samples at a desired output rate. As discussed further below, the fractional downsampling of this invention introduces somewhat more phase jitter than conventional fractional downsamplers, and the communications device 100 is also used as a paradigm of a system that is fairly insensitive to phase jitter.

The device 100 is configured to accommodate a plurality of communication standards, thereby allowing it to be used in different geographic regions, depending upon the communication scheme that is available in each region. The device 100 includes a dual band front end 110 that is configured to selectively receive communications from either the PCS frequency band, or the cellular frequency band, and to provide a down-shifted analog signal at a common intermediate frequency (IF) of 183.6 MHz. (The particular frequencies are presented herein as common examples, although the principles of the decimator in accordance with this invention are applicable at any frequencies.) Downshifting to a common intermediate frequency is a common technique in the art, to allow subsequent stages to be designed independent of the particular modulation frequency of the received signal, and thereby provide better selectivity and dynamic range.

The intermediate frequency (IF) analog signal from the front end 110 is provided to a Quadrature Sigma-Delta analog-to-digital converter (ADC) 150 that is configured to sample the analog signal at a rate that is substantially higher than the required output sample rate, via a quadrature sampler 120, and to filter the high-sample-rate quadrature input samples, via decimators 130. Copending U.S. Patent Application "QUADRATURE ENVELOPE-SAMPLING OF INTERMEDIATE FREQUENCY SIGNAL IN RECEIVER", Ser. No. 09/865,236, filed May 25, 2001 for Yiping Fan, Attorney Docket US018070, presents an apparatus and method for direct IF sampling of a received signal that is modulated by a two-dimensional signal constellation, such as Quadrature Phase Shift Keying (QPSK) and Quadrature Amplitude Modulation (QAM), and is incorporated by reference herein. In this copending application, the direct sampling provides samples at half the Intermediate Frequency, in this example, at 91.3 MHz. Other oversampling techniques are common in the art.

As illustrated, the ADC 150 is configured to support multiple communication standards, including Cellular CDMA (IS-95 A/B), Cellular AMPS, and PCS CDMA (IS-2000 1xRTT). CDMA employs a modulation scheme wherein each data unit (byte, symbol, etc.) is modulated by a selected code-key, and this modulation occurs at a frequency that is termed a "chip-rate". In accordance with the aforementioned IS-95 A/B and IS-2000 1xRTT/1xEV standards, the received code-key-modulated signal is to be sampled at eight-times the chip-rate, to allow the reliable decoding of each data unit in the presence of sampling phase error. In this example, the required output sample rate for CDMA processing is 9.8304 MHz. Note that the chip-rate of the transmitted signal is defined substantially independent of the intermediate sampling rate that used in a particular receiver 100.

In accordance with this invention, the decimators 130 of the Sigma-Delta ADC 150 are configured to provide fractional decimation via the selection of varying integer decimation factors that produce an average output sample rate that corresponds to the desired output rate. For the example CDMA output sample rate of 9.8304 MHz, and a given intermediate sampling rate of 91.8 MHz, the decimation factor is appropriately varied between 9 and 10, corresponding to an average sample ratio of 91.8/9.8304. Note that this desired sample ratio (9.3383789 . . . ) can be achieved in a variety of ways, and in general is achieved by approximating the fractional component to an integer ratio (P/Q) where Q determines the resolution achievable by the approximation. For example, if Q is selected to be 8, the nearest fraction will be ⅜(0.375). As discussed above, in accordance with a preferred embodiment of this invention, for every eight (Q) output samples, five (Q−P) output samples will be produced at each interval of 9(N) input samples, and three (P) output samples will be produced at each interval of 10 (N+1) input samples. This selective sampling will produce an average output sample rate of 9.792 MHz (91.8 MHz/9.375), which is within 0.004% of the desired output sample rate. Greater precision can be achieved by increasing the value of Q. In a preferred embodiment of the communications device 100, Q is selected to be 2048 ($2^{11}$). For the example CDMA output sample rate of 9.8304 MHz, a value of 693 is used for P, thereby providing an average output sample rate of precisely 9.8304 MHz (91.8/(9+693/2048)).

The Cellular AMPS signal is provided at a 40 KHz sampling rate, which is an integer multiple of the oversample rate of 91.8 MHz. In this application, all of the samples will be produced at each interval of 2295(N) input samples.

As noted above, any of a variety of techniques may be used to selectively choose integer decimation factors that provide an average decimation ratio that corresponds to the desired output sample rate. The selection need not be limited to N and N+1, but could be combinations, for example, of N−1, N, N+1, N+2, or any other combinations. The choice of N and N+1 is preferred so as to minimize the phase jitter as different decimation factors are selected. As also noted above, the N and N+1 intervals are preferably interspersed, so as to minimize the accumulation of phase error as repeated leading or lagging output pulses are produced. In a preferred embodiment, the accumulated phase error is contained within +/− a half cycle of the input sampling clock, by switching from leading-to-lagging (N to N+1), or lagging-to-leading (N+1 to N), whenever the accumulated phase error would exceed a half cycle if not switched.

Figure 2:
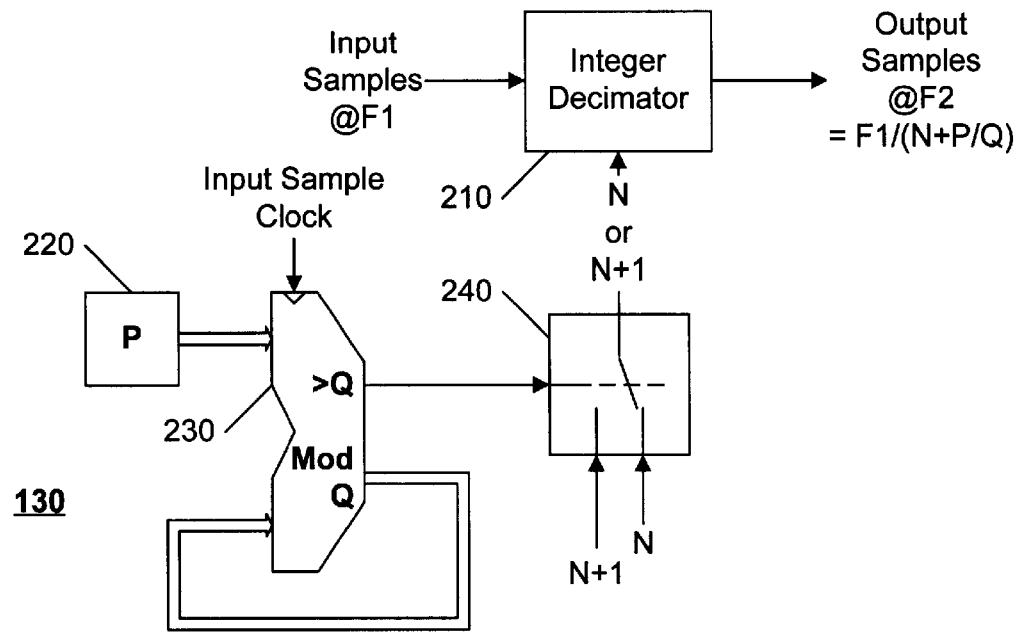
FIG. 2 illustrates an example fractional decimator in accordance with this invention.

FIG. 2 illustrates an example fractional decimator 130 in accordance with this invention that limits the phase jitter to +/− a half cycle of the input sampling clock. In this example, a register 220 contains the determined value of P to achieve a (N+P/Q) sample ratio. A modulo-Q accumulator 230 accumulates successive values of P, and generates an overflow, or carry, signal whenever the accumulated value exceeds Q. If Q is a power of two, the accumulator 230 is merely a conventional accumulator that has a bit width of log2(Q). In the example of Q being 2048 ($2^{11}$), the accumulator 230 is a conventional 11-bit accumulator that overflows whenever the addition of P to the accumulated result exceeds 2048. The overflow signal from the accumulator 230 controls a switch 240 that selectively provides either N or N+1 to an integer decimator 210. The integer decimator 210 is a conventional "divide-by-K" decimator that provides an output sample at every K occurrences of input samples. In this application, K is selectively N or N+1. As is common in the art, and as discussed in the background of this invention, the decimator 210 preferably includes a filter function that determines the value of each output sample based on a weighted average of L input samples, so as to minimize noise and interference contribution to the output samples that would occur if only the $K^{th}$ input sample were used as the corresponding output sample.

The remainder of the accumulation, modulo Q, is fed back as an input to the accumulator 230, thereby maintaining a running accumulation of counts. This accumulation of counts corresponds to a measure of the phase difference between the output sample and an ideal output sample that corresponds to the desired output sample rate. As each overflow occurs, the count is reduced (because P<Q), corresponding to an insertion of a longer-interval (N+1) sample to compensate for the phase shift caused by the shorter-interval (N) sample(s). By inserting a longer-interval sample whenever the phase count accumulates beyond Q, the magnitude of the phase shift error is limited to a half-cycle of the input sample clock. That is, if the phase error extends beyond the mid-point between the $N^{th}$ input sample and the $(N+1)^{th}$ input sample, the output is produced at the $(N+1)^{th}$ input sample, thereby maintaining the phase error within a half cycle of the input sample clock.

The foregoing merely illustrates the principles of the invention. It will thus be appreciated that those skilled in the art will be able to devise various arrangements which, although not explicitly described or shown herein, embody the principles of the invention and are thus within the spirit and scope of the following claims.

I claim:

1. A communications device comprising:
   a front end device that is configured to provide an analog signal corresponding to a received signal, and
   an analog to digital converter, operably coupled to the front end device, that is configured to provide a series of output samples corresponding to the analog signal, wherein
   the analog to digital converter includes:
      a sampler that is configured to sample the analog signal to provide input samples at an input sample frequency, and
      a decimator that is configured to decimate the input samples to provide the output samples at an average output sample frequency that corresponds to a fractional division of the input sample frequency, and,
   the decimator includes:
      a decimating device that is configured to provide each output sample of the output samples upon an occurrence of an integer number of input samples, and
      a controller, operably coupled to the decimating device, that is configured to vary the integer number so as to provide the output samples at the average output sample frequency.

2. The communications device of claim 1, wherein
   the fractional division corresponds to an integer component, N, and a fraction component, P/Q, where N, P, and Q are integers, and
   the controller is further configured to vary the integer number between N and N+1, such that, for every set of Q output samples, the integer number is controlled to be N for Q−P output samples, and is controlled to be N+1 for P output samples.

3. The communications device of claim 2, wherein
   the controller is further configured to vary the integer number so as to maintain a phase error that is associated with the output samples to within a half cycle of the input sample frequency.

4. The communications device of claim 2, wherein the controller includes
   an accumulator that is configured to accumulate a sum that corresponds to multiples of the integer P, and to provide a control signal to select N+1 as the integer number whenever the sum exceeds Q.

5. The communications device of claim 1, wherein the sampler is a quadrature sampler, and
   the decimator includes a first quadrature decimator and a second quadrature decimator.

6. The communications device of claim 1, wherein the analog to digital converter corresponds to a Sigma-Delta ADC.

7. The communications device of claim 1, wherein the decimator is configured to provide a value of each of the output samples based on values of a plurality of corresponding input samples.

8. An analog to digital converter comprising:
   a sampler that is configured to sample an analog signal to provide input samples at an input sample frequency, and
   a decimator that is configured to decimate the input samples to provide output samples at an average output sample frequency that corresponds to a fractional division of the input sample frequency,
   and,
   the decimator includes:
      a decimating device that is configured to provide each output sample of the output samples upon an occurrence of an integer number of input samples, and
      a controller, operably coupled to the decimating device, that is configured to vary the integer number so as to provide the output samples at the average output sample frequency.

9. The analog to digital converter of claim 8, wherein the fractional division corresponds to an integer component, N, and a fraction component, P/Q, where N, P, and Q are integers, and
   the controller is further configured to vary the integer number between N and N+1, such that, for every set of Q output samples, the integer number is controlled to be N for Q−P output samples, and is controlled to be N+1 for P output samples.

10. The analog to digital converter of claim 9, wherein the controller is further configured to vary the integer number so as to maintain a phase error that is associated with the output samples to within a half cycle of the input sample frequency.

11. The analog to digital converter of claim 9, wherein the controller includes
    an accumulator that is configured to accumulate a sum that corresponds to multiples of the integer P, and to provide a control signal to select N+1 as the integer number whenever the sum exceeds Q.

12. The analog to digital converter of claim 8, wherein the sampler is a quadrature sampler, and
    the decimator includes a first quadrature decimator and a second quadrature decimator.

13. The analog to digital converter of claim 8, wherein the analog to digital converter corresponds to a Sigma-Delta ADC.

14. The analog to digital converter of claim 8, wherein the decimator is configured to provide a value of each of the output samples based on values of a plurality of corresponding input samples.

15. The analog to digital converter of claim 8, wherein the input sampling frequency is substantially higher than the average output sampling frequency.

16. A decimator that is configured to receive input samples at an input sample frequency, and to provide therefrom output samples at an average output sample frequency that corresponds to a fractional division of the input sample frequency, the decimator comprising:
    a decimating device that is configured to provide each output sample of the output samples upon an occurrence of an integer number of input samples, and
    a controller, operably coupled to the decimating device, that is configured to vary the integer number so as to provide the output samples at the average output sample frequency.

17. The decimator of claim 16, wherein the fractional division corresponds to an integer component, N, and a fraction component, P/Q, where N, P, and Q are integers, and
    the controller is further configured to vary the integer number between N and N+1, such that, for every set of Q output samples, the integer number is controlled to be N for Q−P output samples, and is controlled to be N+1 for P output samples.

18. The decimator of claim 17, wherein the controller is further configured to vary the integer number so as to maintain a phase error that is associated with the output samples to within a half cycle of the input sample frequency.

19. The decimator of claim 17, wherein the controller includes
    an accumulator that is configured to accumulate a sum that corresponds to multiples of the integer P, and to provide a control signal to select N+1 as the integer number whenever the sum exceeds Q.

* * * * *